United States Patent
Buchanan (10) Patent No.: US 9,847,129 B2
(45) Date of Patent: Dec. 19, 2017

(54) MEMRISTOR PROGRAMMING ERROR REDUCTION

(71) Applicant: Hewlett Packard Enterprise Development LP, Houston, TX (US)

(72) Inventor: Brent Buchanan, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/324,685

(22) PCT Filed: Jul. 28, 2014

(86) PCT No.: PCT/US2014/048435
§ 371 (c)(1),
(2) Date: Jan. 7, 2017

(87) PCT Pub. No.: WO2016/018218
PCT Pub. Date: Feb. 4, 2016

(65) Prior Publication Data
US 2017/0206962 A1    Jul. 20, 2017

(51) Int. Cl.
G11C 11/00    (2006.01)
G11C 13/00    (2006.01)
G11C 29/52    (2006.01)

(52) U.S. Cl.
CPC .......... *G11C 13/0069* (2013.01); *G11C 29/52* (2013.01); *G11C 2013/0092* (2013.01)

(58) Field of Classification Search
CPC ............ G11C 13/0069; G11C 13/0007; G11C 13/004; G11C 2213/77; G11C 16/00; G11C 17/165; G11C 7/1006; G11C 13/0011; G11C 13/0097; G11C 17/16; G11C 2213/15; G11C 29/027; G11C 29/42; G11C 11/5614; G11C 11/5685; G11C 29/52; G11C 16/0483; G11C 16/26; G11C 16/10; G11C 11/419; G11C 16/08; G11C 16/3459; G11C 7/12; G11C 11/161; G11C 13/0004; G11C 19/28
USPC .................. 365/148, 185.21, 225.7, 227, 63; 711/102
See application file for complete search history.

(56) References Cited

U.S. PATENT DOCUMENTS

| 8,064,248 B2 | 11/2011 | Lung |
| 8,225,180 B2 | 7/2012 | Jiang et al. |
| 8,284,605 B2 | 10/2012 | Tanaka et al. |
| 2009/0154222 A1 | 6/2009 | Chien et al. |
| 2011/0235409 A1 | 9/2011 | Kang et al. |

(Continued)

OTHER PUBLICATIONS

International Searching Authority, The International Search Report and the Written Opinion, dated Feb. 24, 2015, 12 Pages.
(Continued)

*Primary Examiner* — Thong Q Le
(74) *Attorney, Agent, or Firm* — Hewlett Packard Enterprise Patent Department (57) ABSTRACT

Error reduction in memristor programming includes programming an n-th switched memristor of a switched memristor array with an error-corrected target resistance. The error-corrected target resistance is a function of a resistance error of the switched memristor array and a target resistance of the n-th switched memristor. The n-th switched memristor programming is to reduce a total resistance error of the switched memristor array.

13 Claims, 3 Drawing Sheets

(56) References Cited

U.S. PATENT DOCUMENTS

| | | |
|---|---|---|
| 2012/0069630 A1 | 3/2012 | Xi et al. |
| 2012/0087175 A1 | 4/2012 | Zhu et al. |
| 2013/0051123 A1 | 2/2013 | Lee et al. |
| 2013/0166972 A1 | 6/2013 | Seabury et al. |
| 2013/0215669 A1 | 8/2013 | Haukness |
| 2014/0215121 A1* | 7/2014 | Ordentlich .......... G06F 12/0246 711/102 |

OTHER PUBLICATIONS

Jung JG. et al., Spread Programming Using Orthogonal Code for Alleviating Bit Errors of NAND Flash Memory, IEEE, Jan. 9-13, 2010, P1-9, pp. 1-2.

* cited by examiner

MEMRISTOR PROGRAMMING ERROR REDUCTION

CROSS-REFERENCE TO RELATED APPLICATIONS

N/A

STATEMENT REGARDING FEDERALLY SPONSORED RESEARCH OR DEVELOPMENT

N/A

BACKGROUND

A memristor or 'memory resistor,' sometimes also referred to as 'resistive random access memory' (RRAM or ReRAM), is a non-linear, passive, two-terminal electrical device having or exhibiting an instantaneous resistance level or state that is substantially a function of bias history. In particular, a bias (e.g., a voltage or a current) applied across terminals of the memristor may be used to set, select or program a resistance of the memristor. Once programmed, the memristor may retain the programmed resistance for a specified period of time after the bias is removed (e.g., until reprogrammed). As such, a memristor is a two-terminal device that may function as a non-volatile memory where the programmed resistance is stored without the application of power to the memristor.

BRIEF DESCRIPTION OF THE DRAWINGS

Various features of examples in accordance with the principles described herein may be more readily understood with reference to the following detailed description taken in conjunction with the accompanying drawings, where like reference numerals designate like structural elements, and in which.

Certain examples have other features that are one of in addition to and in lieu of the features illustrated in the above-referenced figures. These and other features are detailed below with reference to the above-referenced figures.

DETAILED DESCRIPTION

Examples in accordance with the principles described herein provide error reduction in memristor programming. In particular, an error in a programmed resistance of a switched memristor array may be reduced, according to various examples consistent with the principles described herein. According to various examples, the programmed resistance error is reduced using an error-corrected target resistance that is a function of both a resistance error of the switched memristor array and a target resistance of a switched memristor within the array. Error reduction consistent with the principles described herein may facilitate programming memristors implemented as switched memristor arrays with a precision analog value or with precision analog data, according to various examples. Moreover, error reduction as described herein provides a memristor cell that is fault tolerant and that may further include a 'spare' memristor for use in the event of a memristor failure, according to some examples.

Figure 1:
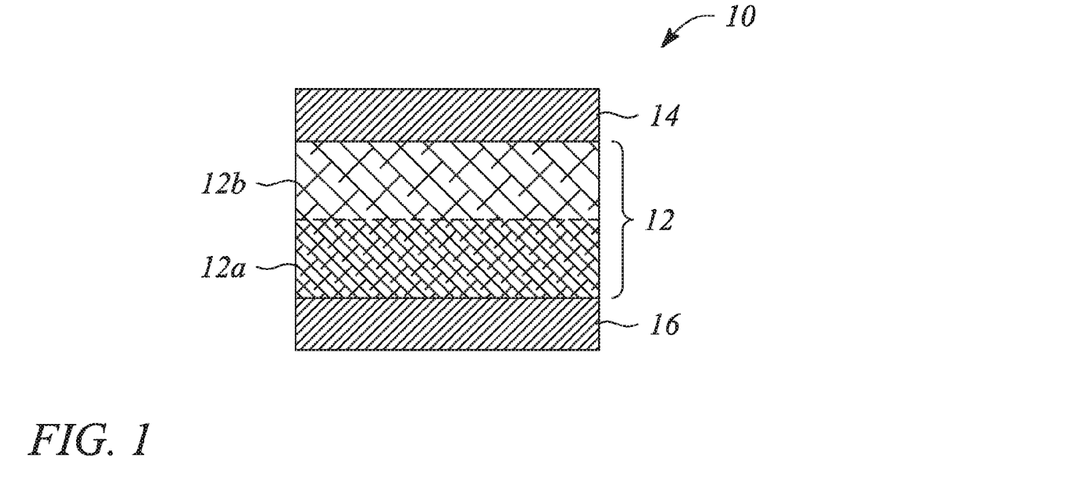
FIG. 1 illustrates a cross sectional view of a memristor, according to an example consistent with the principles described herein.

FIG. 1 illustrates a cross sectional view of a memristor 10, according to an example consistent with the principles described herein. The memristor 10, as illustrated, is a two terminal device including a layer 12 of a memristor switching material, also referred to as a memristor matrix or switching matrix of the memristor 10. By definition herein, the 'memristor switching material' is a material that exhibits a switching phenomenon or characteristic when subjected to a stimulus (e.g., a voltage or a current). The memristor matrix layer 12 is disposed or 'sandwiched' between a first or 'top' electrode 14 and a second or 'bottom' electrode 16. The first and second electrodes 14, 16 facilitate applying a stimulus or 'programming signal' to affect a change in the memristor matrix layer 12. According to some examples, one or both of the first electrode 14 and the second electrode 16 may also participate in the switching phenomenon of the memristor matrix (e.g., as a donor or acceptor of a dopant).

In various examples, the memristor matrix layer 12 of the memristor 10 may include any of a variety of oxides, nitrides and even sulfides that can be formed into a layer between a pair of electrodes. For example, a titanium oxide ($TiO_2$) may be used as the oxide layer in a memristor. Other oxides that may be employed include, but are not limited to, hafnium oxide, nickel oxide, nickel oxide doped with chromium, strontium titanate, chromium doped strontium titanate, tantalum oxide, niobium, and tungsten oxide, for example. Nitrides used as a nitride layer of a memristor include, but are not limited to, aluminum nitride and silicon nitride. In addition, other compounds including, but not limited to, antimony telluride, antimony germanium telluride or silver-doped amorphous silicon may be employed, for example.

In some examples, the memristor matrix layer 12 may include a crystalline oxide (e.g., an oxide layer). In other examples, the memristor matrix layer 12 may include a crystalline nitride (e.g., a nitride layer). In some of these examples, the crystalline oxide or nitride may be monocrystalline. In other examples, the memristor matrix layer 12 includes an amorphous oxide or nitride. In yet other examples, the memristor matrix layer 12 includes either a nanocrystalline oxide or nitride or a microcrystalline oxide or nitride. A nanocrystalline oxide or nitride is an oxide or nitride that includes a plurality of nanoscale crystallites while a microcrystalline oxide or nitride may include crystallites having sizes in the micron range, for example.

In some examples, the memristor matrix layer 12 may include a plurality of layers. A first layer of the plurality may be a stoichiometric oxide (e.g., $TiO_2$, $HfO_2$, etc.) while a second layer may be an oxygen depleted or oxygen deficient oxide layer (e.g., $TiO_{2-x}$, $HfO_{2-x}$, etc.) where '2–x' denotes an oxygen deficiency, and where x is greater than 0 and less than about 2). For example, the oxygen deficient $TiO_{2-x}$ may have values of x that are greater than about $10^{-5}$ and less than about $10^{-2}$. In another example, the oxygen deficient $TiO_{2-x}$ may have a value of x that ranges up to about 1.0. Similarly, a first layer of the plurality of layers of the memristor matrix layer 12 may be a stoichiometric nitride (e.g., AlN, $Si_3N_4$, etc.) while a second layer may be a nitrogen depleted or nitrogen deficient nitride layer (e.g., $AlN_{1-y}$, $Si_3N_{4-y}$, etc.), where y is a value that effectively represents nitrogen depletion in the respective stoichiometric nitride. In some examples, these oxygen deficient or nitrogen deficient layers may be referred to as 'suboxides' or 'subnitrides', respectively.

According to some examples, the change in the memristor matrix layer 12 produced by the programming signal may be understood in terms of oxygen (or nitrogen) migration within the memristor matrix layer 12. For example, a boundary between a layer of memristor matrix material 12b that is deficient in oxygen/nitrogen (e.g., the suboxide/subnitride layer) and another effectively stoichiometric memristor matrix material layer 12a (i.e., oxide/nitride that is not oxygen/nitride deficient) may move as a result of exposure to the programming signal. The movement of the boundary may result from oxygen or nitrogen migration under the influence of the programming signal, for example. A final location of the movable boundary may establish the 'programmed' resistance of the memristor 10, according to some examples.

Alternatively, the change in the memristor matrix layer 12 may be understood in terms of a formation of current filaments, according to some examples. In either case, a conduction channel may be formed by the programming signal that results in a change in the programmed resistance of the memristor matrix layer 12 as measured between the first and second electrodes 14, 16. In general, the 'programmed resistance' is substantially an analog resistance (i.e., has a substantially continuous, analog resistance value between a maximum and minimum resistance value). In particular, the 'programmed resistance' may be programmed to exhibit substantially any resistance value between a maximum resistance and a minimum resistance of the memristor 10, by definition herein.

According to various examples, the first and second electrodes 14, 16 include a conductor. For example, the first electrode 14 and the second electrode 16 may include a conductive metal. The conductive metal used for the first and second electrodes 14, 16 may include, but is not limited to, gold (Au), silver (Ag), copper (Cu), aluminum (Al), palladium (Pd), platinum (Pt), tungsten (W), vanadium (V), tantalum (Ta), and titanium (Ti) as well as alloys thereof, for example. Other conductive metals and other conductive materials (e.g., a highly doped semiconductor, conductive oxides, conductive nitrides, etc.) may also be employed as the first electrode 14 and the second electrode 16, according to various examples. Moreover, the conductive material need not be the same in the first electrode 14 and the second electrode 16.

Additionally, one or both of the first electrode 14 and the second electrode 16 may include more than one layer. For example, a layer of Ti may be employed between a Pt-based electrode and a titanium oxide-based memristor matrix layer 12. The Ti layer may assist in providing an oxygen deficient layer (i.e., $TiO_{2-x}$) in the titanium oxide-based memristor matrix layer 12, for example. In still other examples, materials used in the electrodes 14, 16 may act as a diffusion barrier. For example, titanium nitride (TiN) may be employed as a diffusion barrier (e.g., to prevent material diffusion between the respective electrodes 14, 16 and the memristor matrix 12).

In some examples, a conductive material of one or both of the first electrode 14 and the second electrode 16 may include a metallic form or constituent of a metal oxide used as the memristor matrix layer 12. For example, a Ti metal may be employed in one or both of the electrodes 14, 16 when the memristor matrix layer 12 includes $TiO_2$. Similarly, one or both of the electrodes 14, 16 may include Ta when the memristor matrix layer 12 includes $Ta_2O_5$. In yet other examples, a refractory material such as tungsten may be used in one or both of the electrodes 14, 16.

According to various examples, the memristor 10 may provide 'storage' of the programmed resistance. In particular, the programmed resistance may be stored in a non-volatile manner by the memristor 10 by programming a particular resistance, according to some examples. For example, programming may establish a first programmed resistance of the memristor 10. After programming, the memristor 10 may be once again programmed (i.e., reprogrammed) to establish a second programmed resistance that is different from the first programmed resistance, for example. When not being programmed, the memristor 10 may substantially retain the programmed resistance (e.g., even in the absence of applied power).

The memristor 10 may be programmed by passing a current through the memristor 10, according to various examples. In particular, a particular programmed resistance may be programmed or set by application of an external signal referred to herein as a 'programming' signal. The programming signal may include one or both of a voltage and a current that is applied to the memristor 10. For example, the programming signal may be an applied voltage that induces the current through the memristor 10. By definition herein, a 'bipolar' memristor is a memristor in which a polarity of the programming signal (e.g., the applied voltage and, in turn, a direction of the current induced therein) dictates how the programmed resistance of the memristor is affected or changed by the programming signal. For example, a programming signal having a first polarity may increase the programmed resistance, while a programming signal having a second polarity may decrease the programmed resistance of the bipolar memristor. In other examples, the memristor may be 'unipolar' memristor in which a predetermined change in the programmed resistance occurs regardless of, or substantially independent of, a polarity of a programming signal, by definition herein.

Herein, the term 'switched' when used as an adjective herein means 'switchable', and in some examples, means that a switch capable of having alternative ON and OFF states is included. For example, a 'switched memristor' includes a memristor and a switch, by definition herein. The term 'programmed' when used as an adjective herein means 'programmable'.

Herein, a 'non-transitory computer readable medium' is defined as substantially any data storage medium that provides non-transitory storage of information that may be read or otherwise utilized by a computer. For example, computer readable memory including, but not limited to, one or more of random access memory (RAM), read-only memory (ROM), programmable or erasable ROM and flash memory (e.g., a thumb drive) are all non-transitory computer readable medium, by definition herein. Other examples of non-transitory computer readable medium include, but are not limited to, various types of magnetic disks and disk drives (e.g., a hard disk drive, a floppy disk drive, a floppy diskette, etc.) along with various optical discs and disc drives (e.g., CD, CD-R, CD-RW, DVD, etc.), by definition herein. In addition, network attached storage, so-called 'cloud' storage (e.g., remote data storage accessible via the Internet), and various other types of computer readable medium used by modern computing systems may be non-transitory computer readable medium, by definition herein.

Further, as used herein, the article 'a' is intended to have its ordinary meaning in the patent arts, namely 'one or more'. For example, 'a memristor' means one or more memristors and as such, 'the memristor' means 'the memristor(s)' herein. Also, any reference herein to 'top', 'bottom', 'upper', 'lower', 'up', 'down', 'front', back', 'left' or 'right' is not intended to be a limitation herein. Herein, the term 'about' when applied to a value generally means within the tolerance range of the equipment used to produce the value, or in some examples, means plus or minus 10%, or plus or minus 5%, or plus or minus 1%, unless otherwise expressly specified. Further, the term 'substantially' as used herein means a majority, or almost all, or all, or an amount within a range of about 51% to about 100%, for example. Moreover, examples herein are intended to be illustrative only and are presented for discussion purposes and not by way of limitation.

Figure 2:
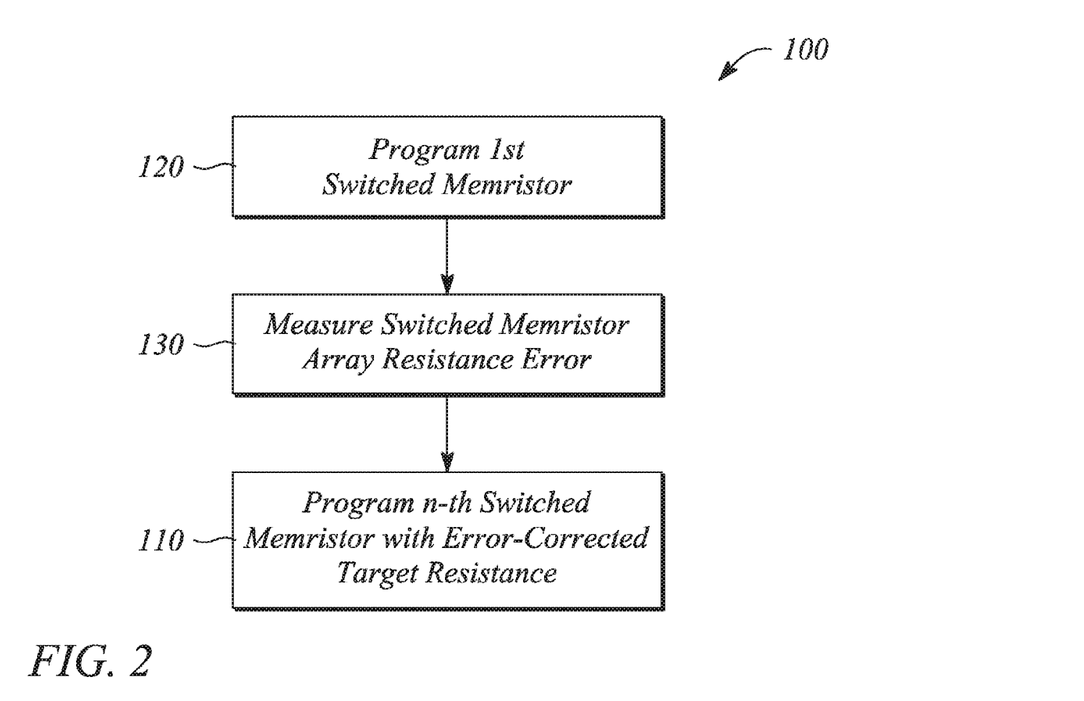
FIG. 2 illustrates a flow chart of a method of error reduction in memristor programming, according to an example consistent with the principles described herein.

FIG. 2 illustrates a flow chart of a method 100 of error reduction in memristor programming, according to an example consistent with the principles described herein. According to various examples, the method 100 of error reduction provides error-reduced programming of a switched memristor array. In particular, the error reduction may reduce a total resistance error of a programmed resistance of the switched memristor array, according to various examples. According to some examples, the programmed resistance is an analog resistance having a value between a minimum resistance and a maximum resistance of the switched memristor array.

According to various examples, the switched memristor array includes a plurality of switched memristors connected in series with one another. In particular, the plurality may include N switched memristors connected in series, where N is defined as an integer greater than one. For example, N may equal two (2), or three (3), or four (4), five (5), and so on. In another example, N may equal about eight (8) or about sixteen (16) in yet another example. By definition herein, a switched memristor of the switched memristor array includes a switch connected in parallel with a memristor. As such, a switched memristor array with N equal to 8 switched memristors includes 8 switches and 8 memristors, each of the 8 switches being connected in parallel with a different one of the 8 memristors. In addition, see the discussion below regarding switched memristor arrays with respect to FIG. 3. According to various examples, a resistance of the switched memristor array includes resistances of the N switched memristors.

As illustrated in FIG. 2, the method 100 of error reduction includes programming 110 an n-th switched memristor of the switch memristor array with an error-corrected target resistance. According to various examples, the error-corrected target resistance is a function of a resistance error of the switched memristor array and a target resistance of the n-th switched memristor. In particular, the n-th switched memristor is programmed 110 to have the target resistance modified by the switched memristor array resistance error, according to various examples. The switched memristor array resistance error may be measured prior to programming 110, for example, as described below. Herein, by definition, n is a positive (non-zero) integer ranging from one to N (i.e., 1≤n≤N). For example, n may equal 1, 2, 3 or 4, and so on, up to N when considering the n-th switched memristor of the switched memristor array having N switched memristors.

By definition herein, the target resistance of the n-th switched memristor is a resistance that is intended (i.e., a resistance goal) for the n-th switched memristor if memristor programming were 'error-free' programming. Further according to various examples, a target resistance of the switched memristor array is a combination of the target resistances of individual switched memristors of the switched memristor array, by definition. For example, the target resistances of N switched memristors of the switched memristor array may all be substantially equal to one another and will combine or sum together to provide the target resistance of the switched memristor array. In another example, the target resistances are chosen to have different values that combine (e.g., sum, etc.) to provide the target resistance of the switched memristor array, assuming error-free programming. Further by definition herein, a difference between a target resistance and an actual (e.g., measured) programmed resistance of either an individual switched memristor or the switched memristor array is 'a resistance error'.

In some examples, the function of the resistance error and the target resistance includes noise shaping using the resistance error to provide the error-corrected target resistance. In particular, in some examples, noise shaping may include first-order difference noise shaping. In another example, the noise shaping may include second-order difference noise shaping. In yet other examples, another noise shaping process may be employed (e.g., another order of difference noise shaping). In other examples, another function such as, but not limited to, a function that includes an average resistance error may be employed to provide the error-corrected target resistance that is to be used in programming 110 the n-th switched memristor.

According to an example of first-order difference noise shaping, the error-corrected target resistance $R_n^C$ of the n-th switched memristor may be given by equation (1) as $$R_n^C = R_n^T - R_{n-1}^E \quad (1)$$

where $R_n^T$ is the target resistance of the n-th switched memristor and $R_{n-1}^E$ is the resistance error of the switched memristor array prior to programming the n-th switched memristor, and where $R_0^E$ is equal to zero. According to various examples, when n is equal to one (n=1), the resistance error $R_{n-1}^E$ in equation (1) is identically zero, by definition herein. The error-corrected target resistance $R_n^C$ of the n-th switched memristor given by equation (1) may be employed when the switched memristor array includes the N switched memristors connected in series, for example.

According to an example of second-order difference noise shaping, the error-corrected target resistance $R_n^C$, of the n-th switched memristor is given by equation (3) as $$R_n^C = R_n^T - 2R_{n-1}^E + R_{n-2}^E \quad (2)$$

where $R_n^T$ is the target resistance of the n-th switched memristor, $R_{n-1}^E$ is the resistance error of the switched memristor array prior to programming the n-th switched memristor, and $R_{n-2}^E$ is the resistance error of the switched memristor array prior to programming the (n−1)-th switched memristor. As provided above for the first-order difference noise shaping, $R_0^E$ is equal to zero (i.e., $R_{n-1}^E$=0 for n=1 and $R_{n-2}^E$=0 for n=1 and n=2), by definition.

According to some examples, the resistance error of the switched memristor array is an error in a programmed resistance of a previously programmed switched memristor. In particular, the switched memristor array resistance error $R_{n-1}^E$ may be defined as an error in the programmed resistance of an (n−1)-th switched memristor. For example, the (n−1)-th switched memristor may have been programmed with a resistance before programming 110 the n-th switched memristor. After being programmed, the (n−1)-th switched memristor may exhibit the resistance error $R_{n-1}^E$. The resistance error $R_{n-1}^E$ may be exhibited by the previously programmed (n−1)-th switched memristor exclusive of any other switched memristor of the switched memristor array, for example. Similarly, the switched memristor array resistance error $R_{n-2}^E$ may be a resistance error exhibited by the (n−2)-th switched memristor (e.g., also exclusive of any other previously programmed switched memristor). According to some examples, the error in the programmed resistance of the (n−1)-th switched memristor may be determined by measuring a resistance error of the (n−1)-th switched memristor with all other switched memristors of the switched memristor array turned OFF.

According to other examples, the resistance error of the switched memristor array is a total error in programmed resistances of all of the switched memristors of the switched memristor array up to, but not including, the n-th switched memristor. In particular, the switched memristor array resistance error may include all of the programmed resistance errors of all switched memristors programmed prior to programming 110 the n-th switched memristor. For example, the switched memristor array resistance error $R_{n-1}^E$ of a series-connected array of N switched memristors may be defined as a sum of the individual programmed resistance errors in the switched memristors up to and including the (n−1)-th switched memristors (i.e., $R_{n-1}^E = \Sigma_{i=1}^{n-1} R_i^E$). According to some examples, the total error in the programmed resistances of all of the previously programmed switched memristors may be determined by measuring a resistance error of the switched memristor array prior to programming the n-th switched memristor. The resistance error measurement may be performed by switching OFF all switched memristors (e.g., the n-th through the N-th switched memristors) that have not yet been programmed, for example.

Referring again to FIG. 2, in some examples, the method 100 of error reduction in memristor programming may further include programming 120 a first switched memristor. In particular, the first switched memristor may be programmed 120 with a target resistance prior to programming the n-th switched memristor of a switched memristor array. As such, programming 120 the first switched memristor, when included in some examples, is performed before programming 110 the n-th switched memristor. The target resistance used in programming 120 the first switched memristor may not include any error correction, according to various examples. For example, the resistance error of the switched memristor array is equal to zero, by definition herein, before any switched memristors have been programmed. In other examples (not illustrated), the first switched memristor of the switched memristor array may be provided with a pre-programmed resistance.

According to some examples, the method 100 of error reduction in memristor programming may further include measuring 130 the resistance error of the switched memristor array prior to programming 110 the n-th switched memristor. For example, measuring 130 the resistance error may include measuring the programmed resistance of the (n−1)-th switched memristor with all of the other switched memristors of the switched memristor array turned OFF. Then, the measured programmed resistance of the (n−1)-th switched memristor may be compared (e.g., subtracted from) the target resistance of the (n−1)-th switched memristor to provide the measured 130 resistance error of the switched memristor array. In another example, measuring 130 the resistance error of the switched memristor array may include measuring a total programmed resistance of a previously programmed portion of the switched memristor array and comparing (e.g., subtracting) the measured programmed resistance and a target programmed resistance for the previously programmed portion to produce the measured 130 resistance error. When programming 110 the n-th switched memristor, the 'previously programmed portion' may include switched memristors from a first (i.e., n=1) to an (n−1)-th switched memristor, for example. The total programmed resistance of the previously programmed portion may be measured by switching OFF all un-programmed switched memristors (e.g., the n-th through the N-th switched memristor) and measuring the resistance of remaining switched memristors that are ON, according to some examples.

Figure 3:
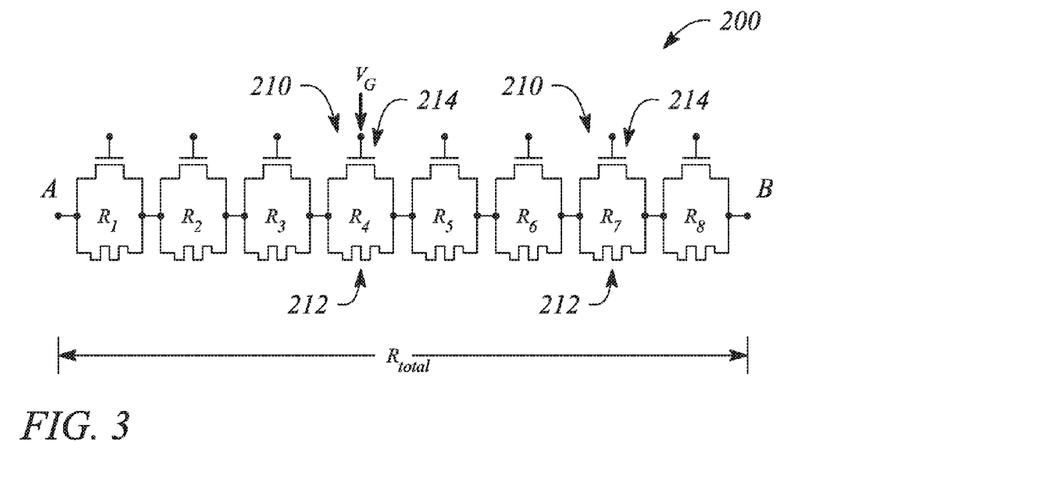
FIG. 3 illustrates a schematic diagram of a switched memristor array, according to an example consistent with the principles described herein.

FIG. 3 illustrates a schematic diagram of a switched memristor array 200, according to an example consistent with the principles described herein. In particular, FIG. 3 illustrates a plurality of switched memristors 210 connected in series with one another to form the switched memristor array 200, by way of example and not limitation. The series-connected switched memristors 210 may be referred to as a 'NAND string' or a 'NAND-structured series' of switched memristors 210, for example. The 'NAND' terminology is due to a similarity with a configuration of switches employed in a 'not-and' or NAND gate. According to various examples, the switched memristor array 200 of FIG. 3 may represent the switched memristor array (i.e., the series-connected switched memristor array) used in the method 100 of error reduction, described above.

According to various examples, a switched memristor 210 of the switched memristor array 200 includes a memristor 212 connected in parallel with a switch 214. The memristor 212 of the switched memristor 210 has a programmable resistance configured to provide a programmed resistance of the switched memristor 210, according to various examples. In particular, a resistance of the memristor 212 may be programmed to an arbitrary resistance value between a maximum resistance and a minimum resistance of the memristor 212. As such, the 'programmed resistance' of the memristor 212 is an analog resistance that may be programmed (e.g., by a programming signal) into the memristor 212, by definition herein. Further by definition herein, the 'analog resistance' of memristor 212 may be an arbitrary resistance value.

According to various examples, the memristor 212 is programmed by the application of a programming signal to the memristor 212. The programming signal may include one or both of a programming voltage applied to and a programming current flowing through the memristor 212, for example. Further, the programmed resistance is substantially maintained by the memristor 212 after being programmed, according to various examples. In particular, the memristor 212 may 'store' the programmed resistance in a substantially non-volatile manner in the absence of an applied power source (e.g., a voltage source, current source, etc.). Further, the programmed resistance is substantially maintained until the memristor 212 is reprogrammed by the application of another programming signal, according to various examples.

The switch 214, which is connected in parallel with the memristor 212, is configured to provide selection of the memristor 212 of the switched memristor 210. In particular, when the switch 214 is 'ON' or closed, the memristor 112 of the switched memristor 210 is substantially bypassed or 'removed from' the plurality of switched memristors 210. For example, an electric current flowing through the plurality of switched memristors 210 connected in series (as in FIG. 3) substantially flows through the closed switch 214 of the switched memristor 210 instead of through the bypassed memristor 212. As a result, the programmed resistance of the bypassed memristor 212 generally does not contribute in a substantial manner to a total resistance of the switched memristor array 200. The switched memristor 210 having the bypassed memristor 212 (i.e., with the switch 214 closed or 'ON') is 'switched OFF' by definition herein. On the other hand, when the switch 214 is 'OFF' or open, the memristor 212 connected in parallel with the switch 214 of the switched memristor 110 is not bypassed. As a result, the programmed resistance of the memristor 212 contributes to the total resistance of the switched memristor array 200. Herein, the switched memristor 210 in which the memristor 212 is not bypassed (i.e., having the switch 214 open or 'OFF') is 'switched ON,' by definition herein.

In some examples, the switch 214 may be or include a solid-state switch such as, but not limited to, a field effect transistor (FET). For example, the switch 214 may include a FET with a source of the FET connected to a first terminal of the memristor 212 and a drain of the FET connected to a second terminal of the memristor 212. The FET may be an n-channel or a p-channel FET (e.g., an n-channel or a p-channel metal-oxide FET or MOSFET), according to some examples. The switch 214 that is or that includes a FET (e.g., an enhancement mode MOSFET) may be turned ON and OFF by appropriate application of a gate voltage $V_G$ to a gate of the FET. For example, a positive gate voltage $V_G$ may turn ON an n-channel FET when a gate-to-source voltage $V_{GS}$ exceeds a threshold voltage $V_T$ of the n-channel FET (e.g., the n-channel FET is ON for $V_G$ such that $V_{GS} > V_T$). Removal or reduction of the positive gate voltage $V_G$ such that the gate-to-source voltage $V_{GS}$ is less than the threshold voltage $V_T$ may cause the n-channel FET to turn OFF (e.g., the n-channel FET is OFF for $V_G$ such that $V_{GS} < V_T$). In another example using a different type of FET (e.g., a depletion mode MOSFET), application of the gate voltage $V_G$ may turn OFF the FET while removal of the gate voltage $V_G$ may turn ON the FET. In other examples, the switch 214 may be implemented using another type of transistor switch (e.g., bipolar transistor) or even a non transistor-based switch (e.g., microelectromechanical system (MEMS) switch), for example.

FIG. 3 illustrates a switched memristor array 200 that includes eight (8) individual memristors 212 and eight (8) parallel-connected switches 214 to make up eight (8) switched memristors 210 (i.e., N=8), by way of example and not limitation. The eight (8) switches 214 of the eight (8) switched memristors 210 in FIG. 3 are FET switches, as illustrated. Further as illustrated, the eight (8) individual memristors 212 may be programmed with eight (8) separate or distinct programmed resistance values $R_1, R_2, \ldots, R_8$, respectively, wherein the separate resistance values may be different, or one or more may have the same value. Similarly, the N individual memristors 212 may be programmed with N separate or distinct programmed resistance values $R_1, R_2, \ldots, R_N$, respectively, wherein the separate resistance values may be different, or one or more may have the same value. Other than being between a maximum resistance value $R_{max}$ and a minimum resistance value $R_{min}$ of a respective individual memristor 212, each of the programmed resistance values $R_n$ may be substantially any, arbitrarily chosen, analog value of resistance. A resistance (e.g., a total resistance $R_{total}$) of the switched memristor array 200 may be measured from a first terminal A to a second terminal B illustrated in FIG. 3, for example.

Although not explicitly illustrated, it is possible to select a single memristor 210 of the plurality of switched memristors 210 by turning ON a selected switched memristor 210 of the plurality and turning OFF (e.g., bypassing) all of the other switched memristors 210. With only the selected switched memristor 210 turned ON, all of the non-selected switched memristors 210 are bypassed and thus do not contribute to a total resistance $R_{total}$ of the switched memristor array 200. Selecting a single switched memristor 210 may allow programming a resistance of the memristor 212 or measuring a programmed resistance of the memristor 212 within the selected switched memristor 210, for example. Similarly, a set of switched memristors 210 may be selected by turning ON only those being selected to facilitate measuring a total programmed resistance of the switched memristor array 200 that includes only the selected set of switched memristors 210, for example.

According to various examples, the switched memristor array 200 is both fault tolerant as illustrated in FIG. 3 and may include one or more 'spare' memristors (not illustrated) to provide additional fault tolerance. Specifically, if a particular memristor 212 becomes degraded or fails, the particular or 'failed' memristor 212 may be effectively removed from the switched memristor array 200 by turning OFF (e.g., bypassing) the switched memristor 210 that includes the failed memristor 212. The ability to turn OFF switched memristors 210 having a failed or degraded memristor imparts a level of fault tolerance to the switched memristor array 200, according to various examples.

In some examples (not illustrated), the switched memristor array 200 may further include one or more spare memristors. In particular, the spare memristors may be included in switched memristors that are normally turned OFF (e.g., one or more switched memristors in addition to the 8 switched memristors 212 illustrated in FIG. 3). In the event of the degradation or failure of a memristor 212 of a switched memristor 210, the switched memristor 210 with the degraded or failed memristor 212 may be turned OFF to bypass the degraded or failed memristor 212 (e.g., as described above). Then, a switched memristor containing a spare memristor that is normally turned OFF may be turned ON to allow the spare memristor to be used in place of the failed memristor 212. The inclusion of spare memristors or equivalently 'spare switched memristors' may add additional fault tolerance to the switched memristor array 200, according to various examples.

In some examples, a non-transitory computer readable medium is provided that is configured to implement error reduction in memristor programming. For example, the non-transitory computer readable medium may include instructions that, when executed by a processor, implement error reduction that is substantially similar to the method 100 of error reduction in memristor programming. In particular, in some examples, the instructions may implement programming a first switched memristor of a switched memristor array with a target resistance. The instructions may further implement measuring a resistance error of the switched memristor array. The instructions may further implement programming an n-th switched memristor of a switched memristor array with an error-corrected target resistance. The error-corrected target resistance may include noise shaping using the measured resistance error, for example. According to various examples, the switched memristor array includes N switched memristors connected in series, where n is an integer ranging from two to N. Programming the n-th switched memristor may reduce a total resistance error of a programmed resistance of the switched memristor array, according to some examples.

Figure 4:
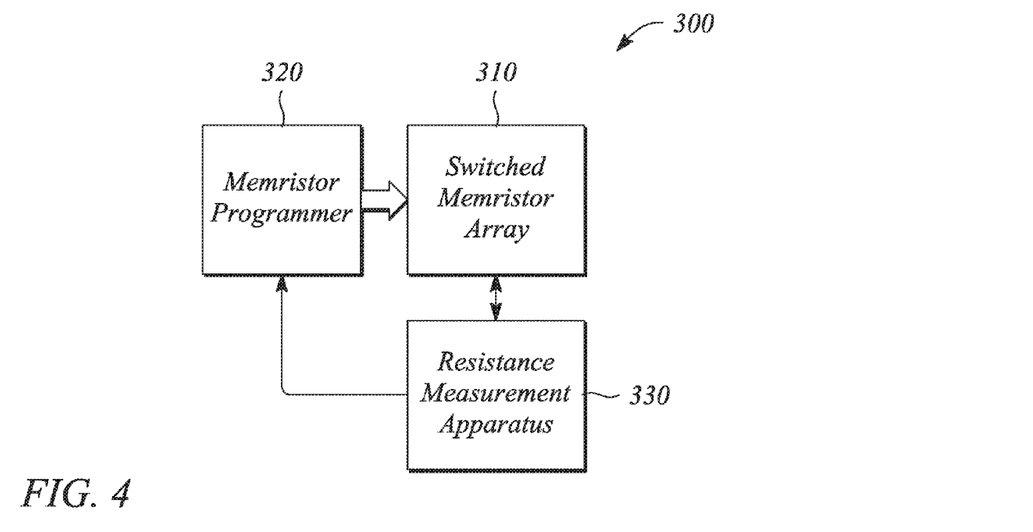
FIG. 4 illustrates a block diagram of an error reduction programmable switched memristor system, according to an example consistent with the principles described herein.

In some examples of the principles described herein, an error reduction programmable switched memristor system is provided. FIG. 4 illustrates a block diagram of an error reduction programmable switched memristor system 300, according to an example consistent with the principles described herein. The error reduction programmable switched memristor system 300 illustrated in FIG. 4 includes a switched memristor array 310. The switched memristor array 310 includes N switched memristors connected together to provide a programmable resistance of the switched memristor array 310. According to various examples, the switched memristor array 310 may be substantially similar to the switched memristor array described above with respect to the method 100 of error reduction in memristor programming as well as with respect to the switched memristor array 200 illustrated and described with respect to FIG. 3.

In particular, in some examples, the switched memristor array 310 includes N switched memristors connected in series. In some examples, a switched memristor includes a field effect transistor (FET) connected in parallel with a memristor. A source of the FET may be connected to a first terminal of the memristor and a drain of the FET may be connected to a second terminal of the memristor, for example. The FET may serve as a switch to provide switch selection of the parallel-connected memristor, according to various examples. In other examples, a switched memristor of the switched memristor array 310 may include another type of switch, other than the FET, connected in parallel with the memristor from the first terminal to the second terminal thereof, to provide switch selection of the memristor. The other type of switch may include, but is not limited to, another type of transistor switch or a non transistor-based switch (e.g., microelectromechanical system (MEMS) switch), for example.

As illustrated in FIG. 4, the error reduction programmable switched memristor system 300 further includes a memristor programmer 320 (e.g., a memristor programming apparatus). The memristor programmer 320 is configured to store analog data in the programmable resistance of the switched memristor array, according to various examples. In particular, the memristor programmer 320 is configured to store the analog data, wherein storing the analog data includes programming an n-th switched memristor of a switched memristor array with an error-corrected target resistance. According to some examples, the error-corrected target resistance is a function of a resistance error of the switched memristor array and a target resistance of the n-th switched memristor. Further, n is an integer ranging from one to N, according to various examples.

In some examples, programming the n-th switched memristor provided by the memristor programmer 320 is substantially similar to programming 110 an n-th switched memristor with an error-corrected target resistance that is described above with respect to the method 100 of error reduction in memristor programming. In particular, in some examples, the function of the resistance error and the target resistance includes noise shaping using the resistance error. In some examples, the noise shaping includes first-order difference noise shaping. For example, the first-order difference noise shaping may be given as in equation (1) above. In some examples, the noise shaping includes second-order difference noise shaping. For example, the second-order difference noise shaping may be as given in equation (2) above.

Figure 5:
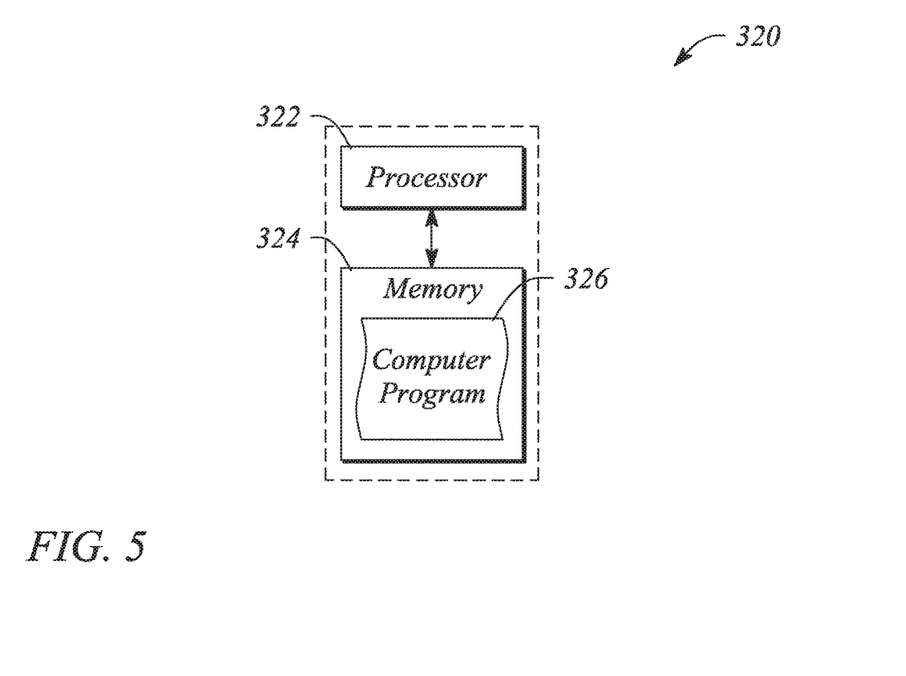
FIG. 5 illustrates a block diagram of a memristor programmer, according to an example consistent with the principles described herein.

FIG. 5 illustrates a block diagram of a memristor programmer 320, according to an example consistent with the principles described herein. As illustrated in FIG. 5, the memristor programmer 320 includes a processor 322, a memory 324 and a computer program 326. The computer program 326 is stored in the memory 324 and includes instructions that, when executed by the processor 322, implement storing the analog data in the programmable resistance of the switched memristor array. For example, the processor 322 may be a processor of a general-purpose computer (e.g., a microprocessor) and the memory 324 may be non-transitory memory (e.g., random access memory, a computer readable medium, etc.) of the general-purpose computer. In another example, a specialized processor such as, but not limited to, a graphics processor, an applications specific integrated circuit (ASIC), a field programmable gate array (FPGA), a parallel processor, a virtual processor (e.g., a cloud based), etc., may be employed as the processor 322. According to various examples, the memory 324 may include, but is not limited to, random access memory (RAM), static RAM (SRAM), and dynamic RAM (DRAM), read-only memory (ROM), erasable programmable ROM (EPROM), electrically erasable programmable ROM (EEPROM), flash memory, a magnetic or an optical disk drive, e.g., a hard disk drive (HDD), a floppy disk drive (FDD), a compact disc read-only memory (CD-ROM), a digital versatile disk (DVD), a thumb drive, and various forms of network attached storage (e.g., cloud-based storage). In some examples, the memory 324 and the stored instructions may be substantially similar to the non-transitory computer readable memory and included instructions described hereinabove.

Referring again to FIG. 4, in some examples, the error reduction programmable switched memristor system 300 further includes a resistance measurement apparatus 330. The resistance measurement apparatus 330 is configured to measure the resistance error of the switched memristor array. For example, the resistance measurement apparatus 330 may include a resistance meter, a voltage source or a current source. In some examples, the resistance error measured by the resistance measurement apparatus 330 is a difference between a target resistance and a programmed resistance of the switched memristor array. In some examples, the target resistance may be stored in and accessed by the resistance measurement apparatus 330 from a memory (e.g., the memory 322 of the memristor programmer 320). In some examples, the resistance error measured by the resistance measurement apparatus 330 is an error in a programmed resistance of an (n−1)-th switched memristor of the switched memristor array.

Thus, there have been described examples of a method of error reduction in memristor programming, a non-transitory computer readable memory to implement memristor programming error reduction, and an error reduction programmable switched memristor system that employ an error-corrected target resistance to program a switched memristor of a switched memristor array. It should be understood that the above-described examples are merely illustrative of some of the many specific examples that represent the principles described herein. Clearly, those skilled in the art can readily devise numerous other arrangements without departing from the scope as defined by the following claims.

What is claimed is:

1. A method of error reduction in memristor programming, the method comprising:
programming an n-th switched memristor of a switched memristor array with an error-corrected target resistance, the error-corrected target resistance being a function of a resistance error of the switched memristor array and a target resistance of the n-th switched memristor, where n is a positive integer ranging from one to N, and N is an integer greater than one;

programming a first switched memristor with a target resistance prior to programming the n-th switched memristor of the switched memristor array; and measuring the resistance error of the switched memristor array prior to programming the n-th switched memristor, wherein n excludes one; and wherein the switched memristor array comprises N switched memristors, each switched memristor comprising a switch connected in parallel with a memristor, and wherein programming the n-th switched memristor reduces a total resistance error of a programmed resistance of the switched memristor array.

2. The method of error reduction in memristor programming of claim 1, wherein the function of the resistance error and the target resistance comprises noise shaping using the resistance error.

3. The method of error reduction in memristor programming of claim 2, wherein the switched memristor array comprises the N switched memristors connected in series, and wherein the noise shaping comprises first-order difference noise shaping, the error-corrected target resistance $R_n^C$ of the n-th switched memristor being given by $$R_n^C = R_n^T - R_{n-1}^E$$

where $R_n^T$ is the target resistance of the n-th switched memristor and $R_{n-1}^E$ is the resistance error of the switched memristor array prior to programming the n-th switched memristor.

4. The method of error reduction in memristor programming of claim 2, wherein the switched memristor array comprises the N switched memristors connected in series, and wherein the noise shaping comprises second-order difference noise shaping, the error-corrected target resistance $R_n^C$ of the n-th switched memristor being given by $$R_n^C = R_n^T - 2R_{n-1}^E + R_{n-2}^E$$

where $R_n^T$ is the target resistance of the n-th switched memristor, $R_{n-1}^E$ is the resistance error of the switched memristor array prior to programming the n-th switched memristor, and $R_{n-2}^E$ is the resistance error of the switched memristor array prior to programming the (n−1)-th switched memristor.

5. The method of error reduction in memristor programming of claim 1, wherein the resistance error of the switched memristor array is an error in a programmed resistance of an (n−1)-th switched memristor.

6. The method of error reduction in memristor programming of claim 1, wherein the resistance error of the switched memristor array is a total error in programmed resistances of all of the switched memristors of the switched memristor array except the n-th switched memristor.

7. A non-transitory computer readable medium including instructions that, when executed by a processor, implement the error reduction in memristor programming of claim 1.

8. A non-transitory computer readable medium including instructions that, when executed by a processor, implement memristor programming error reduction comprising:

programming a first switched memristor of a switched memristor array with a target resistance;

measuring a resistance error of the switched memristor array; and programming an n-th switched memristor of the switched memristor array with an error-corrected target resistance, the error-corrected target resistance comprising noise shaping using the measured resistance error, the noise shaping comprising one of first-order difference noise shaping and second-order difference noise shaping, wherein the switched memristor array comprises N switched memristors connected in series, where n is an integer ranging from two to N and N is an integer greater than one, and wherein programming the n-th switched memristor reduces a total resistance error of a programmed resistance of the switched memristor array.

9. The non-transitory computer readable medium of claim 8, wherein measuring a resistance error of the switched memristor array comprises measuring a resistance error in a programmed resistance of an (n−1)-th switched memristor.

10. An error reduction programmable switched memristor system comprising:

a switched memristor array having N switched memristors connected together to provide a programmable resistance; and a memristor programmer to store analog data in the programmable resistance of the switched memristor array, the analog data is to be stored comprising programming an n-th switched memristor of the switched memristor array with an error-corrected target resistance, the error-corrected target resistance being a function of a resistance error of the switched memristor array and a target resistance of the n-th switched memristor, where n is an integer ranging from one to N, wherein target resistances of the N switched memristors represent the analog data, and wherein programming the n-th switched memristor is to reduce a total resistance error of the switched memristor array.

11. The error reduction programmable switched memristor system of claim 10, wherein the function of the resistance error and the target resistance comprises noise shaping using the resistance error, wherein the noise shaping comprises one of first-order difference noise shaping and second-order difference noise shaping.

12. The error reduction programmable switched memristor system of claim 10, wherein a switched memristor of the switched memristor array comprises a switch connected in parallel with a memristor, the switch being a field effect transistor (FET) with a source of the FET connected to a first terminal of the memristor and a drain of the FET connected to a second terminal of the memristor.

13. The error reduction programmable switched memristor system of claim 10, further comprising:

a resistance measurement apparatus to measure the resistance error of the switched memristor array, the resistance error being an error in a programmed resistance of an (n−1)-th switched memristor, wherein the memristor programmer comprises:

a processor;

a memory; and a computer program stored in the memory, the computer program including instructions that, when executed by the processor, implement the storing of the analog data in the programmable resistance of the switched memristor array.

* * * * *